(12) United States Patent
Atnip

(10) Patent No.: US 8,780,434 B1
(45) Date of Patent: Jul. 15, 2014

(54) MEMS DEVICE WITH SLOPED SUPPORT

(71) Applicant: Texas Instruments Incorporated, Dallas, TX (US)

(72) Inventor: Earl V. Atnip, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 13/734,776

(22) Filed: Jan. 4, 2013

(51) Int. Cl.
*G02B 26/00* (2006.01)
*G02B 26/08* (2006.01)
*B81C 1/00* (2006.01)

(52) U.S. Cl.
CPC ........ *G02B 26/0833* (2013.01); *B81C 1/00642* (2013.01)
USPC .......................................... 359/290; 359/291

(58) Field of Classification Search
CPC .................................................. G02B 26/0841
USPC .................................................. 359/290, 291
See application file for complete search history.

(56) References Cited

U.S. PATENT DOCUMENTS

| | | | |
|---|---|---|---|
| 6,861,363 B2 | 3/2005 | Harchanko et al. | |
| 7,404,909 B2 | 7/2008 | Rothenbury | |
| 2008/0137170 A1* | 6/2008 | Rothenbury | ................... 359/290 |
| 2009/0067025 A1 | 3/2009 | Atnip et al. | |

OTHER PUBLICATIONS

Gan, Ofir et al., "Programmed resist sidewall profiles using sub-resolution binary grayscale masks for Si-photonics applications", BACUS News/Photomask, Jun. 2012, vol. 28, Issue 6.

* cited by examiner

*Primary Examiner* — James Jones
(74) *Attorney, Agent, or Firm* — Warren L. Franz; Frederick J. Telecky, Jr.

(57) ABSTRACT

A microelectromechanical (MEMS) device has a movable member supported in elevated position spaced by a sloped support structure above a substrate. The movable member may be a polished metallic plate such as a mirror of a digital micromirror device (DMD) supported by a flexible hinge above an integrated circuit wafer die region. The plate may supported centrally at a raised juncture of two upwardly oppositely directed and symmetrically converging hinge legs for pivoting about a parallel axis. The plate may also be supported at a top end of a hinge leg in cantilever fashion, for pivoting about a perpendicular axis. Optional spring tips are provided for limiting movement and recovering energy. In a described fabrication method, hinge material is deposited over a sacrificial layer that has been directly or indirectly patterned using a grayscale photoresist exposure to define sloped surfaces which provide a template for configuring the hinge and optional other components.

20 Claims, 17 Drawing Sheets

MEMS DEVICE WITH SLOPED SUPPORT

This relates to microelectronomechanical system (MEMS) devices and their manufacture; and, more particularly, to MEMS devices and the fabrication of MEMS devices having a member supported in elevated position on supporting structure for relative movement spaced by a gap above a substrate.

BACKGROUND

The cost of microelectronomechanical system (MEMS) devices may depend on the complexity of the devices and on the number and complexity of steps utilized for processes employed in their manufacture. Cost reduction may be achievable through reduction of complexity in the structures or reduction of the number or complexity of steps employed in fabrication of such structures.

Examples of MEMS devices and methods of their fabrication to which the principles disclosed herein find application are described in U.S. Pat. No. 7,404,909 B2 and Pub. No. US 2009/0067025 A1, the entireties of both of which are incorporated herein by reference.

SUMMARY

Example implementations of disclosed principles include microelectromechanical (MEMS) devices and methods of their fabrication.

Described example microelectromechanical (MEMS) devices have a sloped support member supporting a movable member in elevated position, spaced by a gap above a substrate. The substrate may be a die region of a silicon wafer on which are formed circuit components of an integrated circuit. The movable member may be a plate, such as a metallic plate with a generally planar configuration having a specular polished upper surface such as useable in a micromirror array MEMS device. The support member may be a metallic flexible hinge. In one implementation, the hinge has an apex centrally positioned at a raised juncture of top ends of two upwardly oppositely directed and symmetrically converging legs whose bottom ends are connected to the substrate, and optionally includes spring tips for limiting and recovering energy in pivotal movement of the plate about an axis parallel to a hinge axis. In another implementation, the hinge has an upper portion positioned at a top end of a leg whose bottom end is connected to the substrate, and optionally includes spring tips for limiting and recovering energy in pivotal movement about an axis perpendicular to a hinge axis.

Described example methods of fabricating MEMS devices include steps for directly or indirectly patterning a first sacrificial layer over the substrate using a grayscale exposure pattern to provide sloped surfaces which provide a template for configuring a layer of hinge material deposited over the patterned first sacrificial layer; forming and planarizing a second sacrificial layer over the patterned first sacrificial layer after defining the sloped hinge from the deposited hinge material; and removing the sacrificial material after forming the movable member over the sloped hinge. The layer of hinge material may be patterned to also form one or more spring tips supported by the movable member or substrate. In a digital micromirror device (DMD) implementation example, the first sacrificial layer may be a directly grayscale exposure patternable photoresist that enables formation of sloped hinges with avoidance of filled via supports or mirror voiding.

BRIEF DESCRIPTION OF THE DRAWINGS

Example embodiments are described with reference to accompanying drawings, wherein.

DETAILED DESCRIPTION OF EXAMPLE EMBODIMENTS

Figure 1:
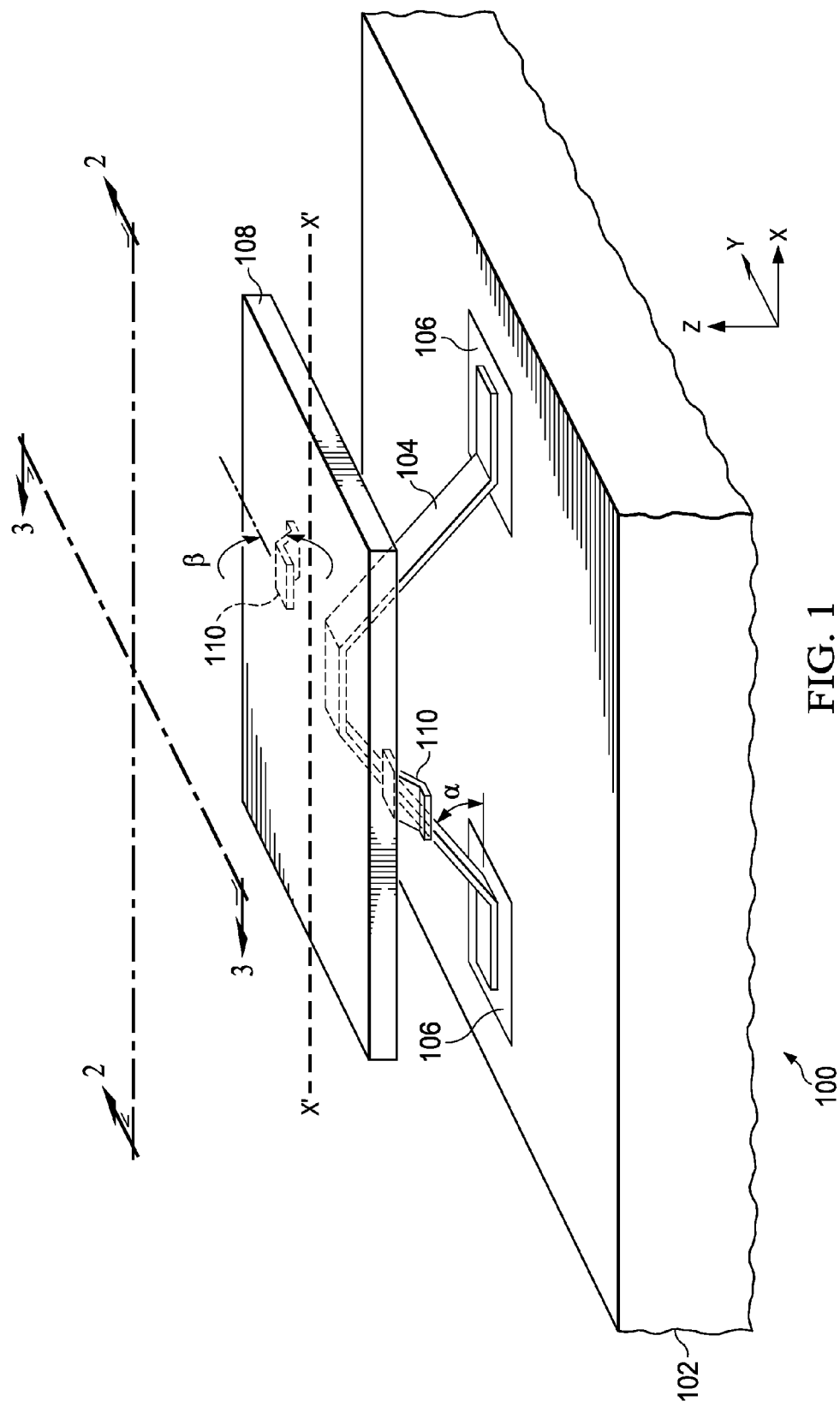
FIG. 1 is a perspective view of an example MEMS device.

FIG. 1 illustrates an example microelectromechanical (MEMS) device 100 with a movable member 108 supported in elevated position by a sloped support member 104, spaced by a gap above a substrate 102. Substrate 102 may be a silicon wafer or other semiconductor substrate, a dielectric laminate or any other suitable base platform. The illustrated substrate is a die region of a silicon wafer, before or after singulation, on which are formed circuit components, including electrodes and other electrical contacts 106, of an integrated circuit. The movable member 108 may take the form of a metallic (e.g., aluminum) plate having a generally planar configuration with a specular polished upper surface, such as is representative of a mirror embodied in a micromirror array of a Texas Instruments DLP™ digital micromirror device (DMD). The support member 104 may take the form of a metallic flexible hinge, having an apex centrally positioned at a raised juncture of top ends of two upwardly oppositely directed and symmetrically converging legs whose bottom ends are connected to respective ones of laterally spaced surface contacts 106. In the illustrated embodiment, the hinge is configured as a thin (thickness small relative to width) elongated element with generally uniform width. The apex presents a generally rectangular and horizontal platform which is coplanar with generally rectangular and horizontal, laterally spaced leg bottom ends. The legs extend upwardly to the apex from their bottom ends with generally uniform slope making an internal angle α of, e.g., 20-70° (for instance, about 30°) with a generally horizontal upper surface of the substrate. The illustrated plate 108 is mounted centrally at its underside on the hinge apex platform for tilting rotationally about a tilt axis X'-X' parallel to the hinge longitudinal axis with flexure of the hinge legs, in response to application of electrostatic forces. The circuit components may take the form of components of a memory cell and electric biasing circuitry utilizable to individually address and selectively set the position of the plate 108.

In the illustrated example, the leg bottoms of hinge 104 are connected directly to respective contact pads 106 formed on the surface of substrate 102 (e.g., silicided regions of a silicon substrate), and the center of the underside of plate 108 is directly connected to the top of the apex platform of hinge 104. Additional one or more layers of other materials may, however, be interposed at the connections to suit individual needs and preferences. Also, connections to substrate 102 may be made to just one contact pad 106, or to substrate locations other than at contact pads, and additional one or more electrodes may be positioned as appropriate for actuating the same or other preferred movement of the plate.

During operation of the illustrated device 100, the plate 108 may be biased and neighboring electrodes energized to cause plate 108 to tilt about the tilt axis in a selected direction to bring closer to the substrate upper surface one or the other of the opposite sides of the plate parallel to the hinge axis. Device 100 may include other features, such as one or more spring tips 110 which are attached to and extend beyond contours of plate 108. Spring tips 110 serve as flexible stops to limit downward movement of the adjacent plate edge, and to assist release from contact with the substrate for movement in the opposite direction by storing energy from the downward movement. Spring tips 110 may advantageously be formed concurrently with, and of a same material as, the sloped hinge 104. For example, in the case of plate 108 implemented as an aluminum mirror, spring tips 110 may be advantageously formed of the thinner and more flexible hinge material. The illustrated spring tips 110 may be thin elongated elements of generally uniform width, with generally rectangular and horizontal upper ends attached marginally at respective edges to the underside of plate 108, and outwardly directed portions extending downwardly at an angle β of, e.g., 70-20° (for instance, about 60°) from the plate plane with generally uniform slope to respective free generally rectangular and horizontal outwardly directed lower ends.

In the case of a MEMS device having the form of a digital micromirror device, the sloped hinge 104 supports the movable mirror member 108 directly, without the necessity for filling a void in the formation of the mirror to provide a support post for coupling the mirror to the hinge as shown, for example, in the fabrication of the micromirror structure described in Pub. No. US 2009/0067025 A1, the entirety of which is incorporated herein by reference. This has the advantage that the specular upper surface of the mirror is an uninterrupted planar surface with no central indentation.

FIGS. 2A-2J and 3A-3J illustrate steps in an example method of fabricating the MEMS device 100 shown in FIG. 1 using photolithography.

Figure 2A:
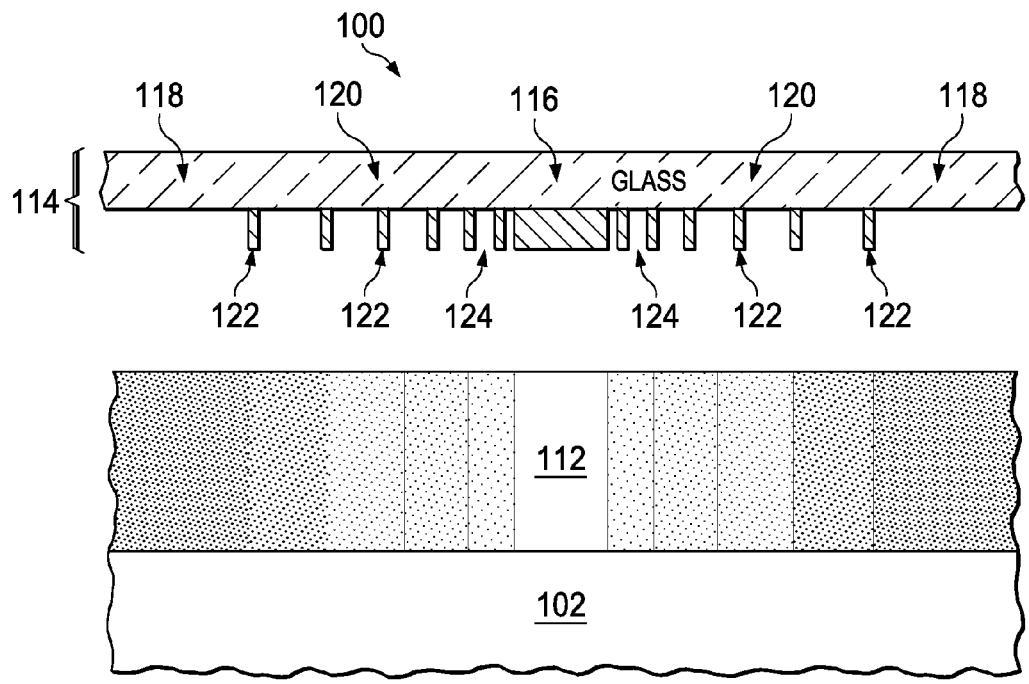
FIGS. 2A-2J and 3A-3J are cross-sectional views illustrating steps in an example method of fabricating a MEMS device, respectively corresponding to views taken along the section lines 2-2 and 3-3 of FIG. 1.
Figure 3A:
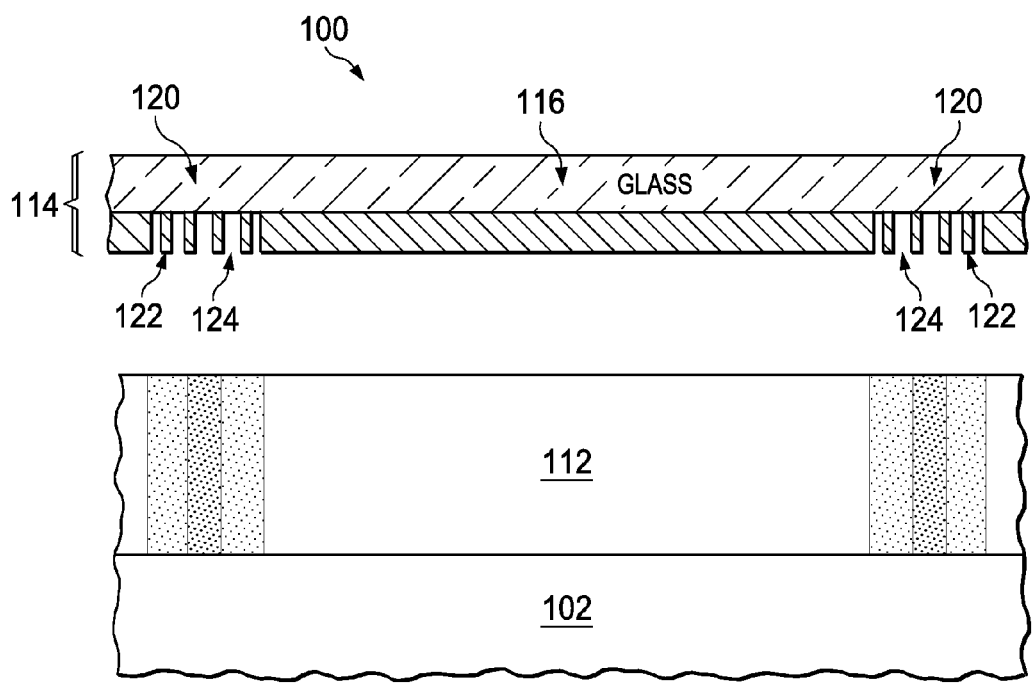

A layer 112 of patternable masking material is formed over substrate 102 as shown in FIGS. 2A and 3A. A suitable material is a relatively lower contrast photoresist that exhibits good grayscale patterning behavior. A positive photoresist such as a DQN photoresist (mixture of diazonaphthoquinone sensitizer material and novolac pheno-formaldehyde resin matrix material) usable with I-line illumination from a mercury-vapor lamp may provide an advantageous grayscale pattern in preference to a chemically amplified positive photoresist.

The photoresist layer 112 is exposed through a mask such as a binary chromium-on-glass photomask 114 to produce a grayscale exposure pattern. FIG. 3A depicts the grayscale pattern schematically as a dot pattern, with a higher density of dots indicating a higher degree of exposure and a lower density of dots indicating a lower degree of exposure. Photomask 114 has solid chromium in areas 116 corresponding to areas of layer 112 that are to receive no exposure, and is free of chromium in areas 118 corresponding to areas of layer 112 that are to receive maximum exposure. Areas 120 on photomask 114 for producing sloped portions of the hinge and spring tips have subresolution chromium geometries 122 and/or subresolution spaces 124 to produce a graded intensity exposure.

Figure 2B:
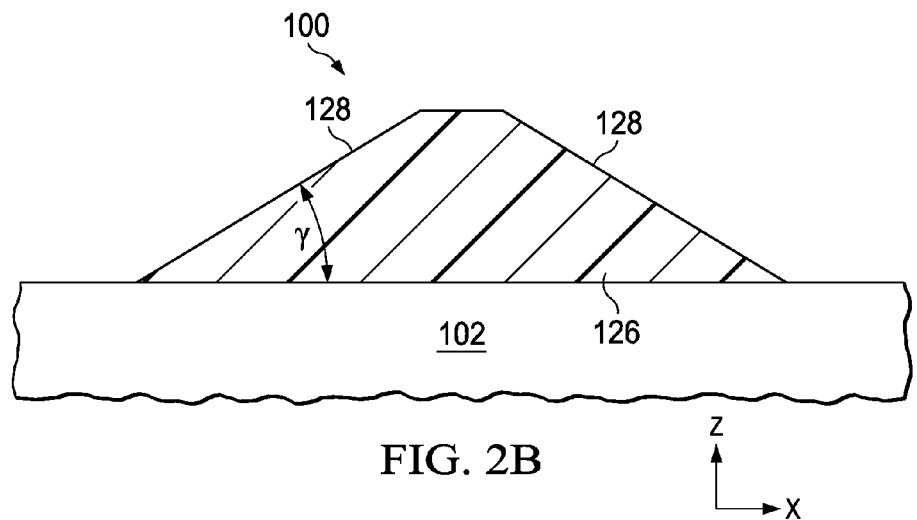
Figure 3B:
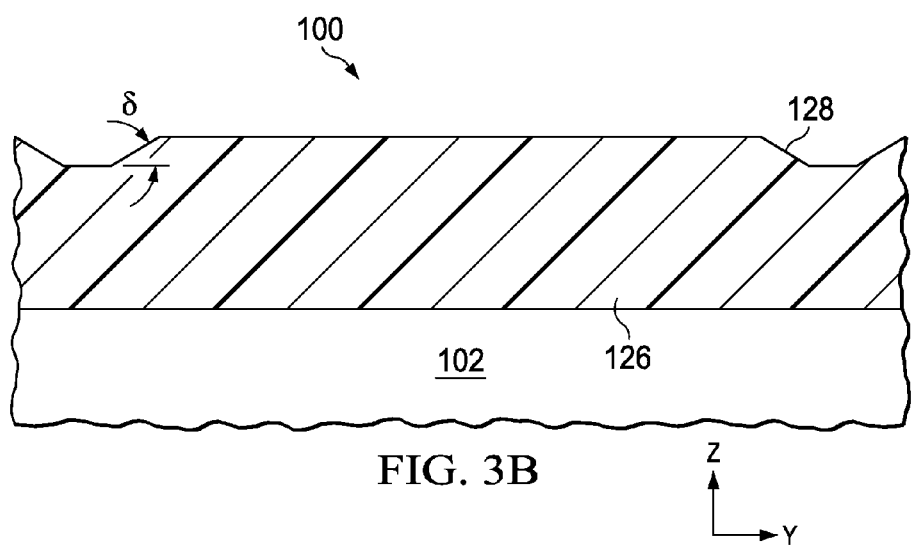

FIGS. 2B and 3B illustrate the structure after performing a positive develop operation which removes the graded intensity exposed positive photoresist to leave a correspondingly graded thickness contoured sacrificial layer 126 over the base substrate 102. The develop operation may include dissolution of exposed positive photoresist in an aqueous solution of tetramethylammonium hydroxide (TMAH or TMAOH). The graded thickness sacrificial layer 126 has sloped surfaces 128 which will be used to produce sloped portions of the sloped hinge 104 and spring tips 110. As an alternative, positive tone photosensitive polyimide may be used in place of the positive photoresist to form the sloped sacrificial layer 126.

As shown in FIG. 2B, the sacrificial layer 126 has a region with a hill-like cross-sectional contour in the X-Z plane which has a generally horizontal central apex portion of maximum thickness (corresponding to minimum intensity exposure) centrally positioned at a raised juncture of two upwardly directed and symmetrically converging sides which extend with uniform opposite slopes (corresponding to uniformly graded grayscale exposure) up from laterally spaced bottom end positions of minimum thickness (corresponding to maximum intensity exposure). For the illustrated embodiment, the sides extend upwardly from their bottom end positions to the apex with generally uniform slope, making an internal angle γ of, e.g., 20-70° (for instance, about 30°), with a generally horizontal upper surface of the substrate 102.

As shown in FIG. 3B, the sacrificial layer 126 also has two laterally spaced regions with identical other less pronounced hill-like cross-sectional contours in the Y-Z plane, each of which has a generally horizontal central recessed base portion of lesser thickness (corresponding to greater intensity exposure) centrally positioned at a lowered juncture of two downwardly directed and symmetrically converging sides which extend with uniform opposite slopes (corresponding to uniformly graded grayscale exposure) down from laterally spaced top end positions of greater thickness (corresponding to lesser intensity exposure). For the illustrated embodiment, the sides extend downwardly from their top end positions to the base with generally uniform slope, making an external angle δ of, e.g., 20-70° (for instance, about 30°), with the generally horizontal base of the recess. A generally flat horizontal planar region of maximum thickness separates the two less pronounced hill-like cross-sectional contours.

Patterning of sloped sidewalls using grayscale photolithography techniques is further described in an article by O. Gan, et al., entitled "Programmed resist sidewall profiles using sub-resolution binary grayscale masks for Si-photonics applications," appearing in BACUS News/Photomask, Vol. 28, Issue 6 (SPIE Society of Photo-Optical Instrumentation Engineers June 2012), the entirety of which is incorporated herein by reference.

Figure 2C:
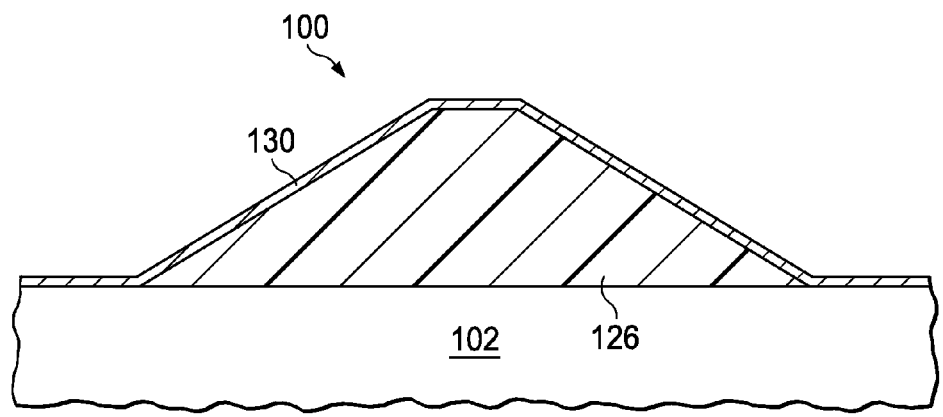
Figure 3C:
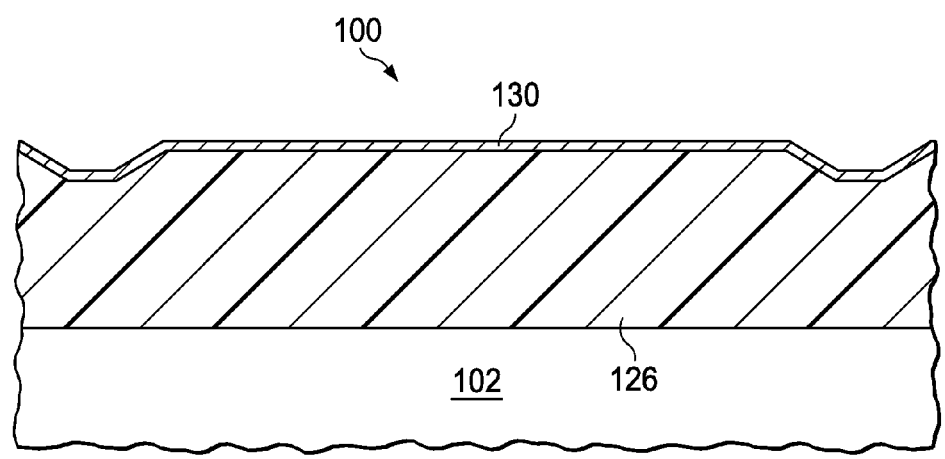

As shown in FIGS. 2C and 3C, a thin layer of hinge material 130 is formed over the grayscale patterned sacrificial layer 126, over the hill-like and other hill-like contours including over the flat horizontal planar region that separates the other hill-like contours. The hinge material layer 130 may be any of various metals, semiconductor materials, polymers and/or inorganic dielectric materials, with the specific choice determined by needs and preferences consistent with the intended end function of the MEMS device 100. In the case of a device 100 having the form of a digital micromirror device, for example, layer 103 may be a conductive metallic layer formed outwardly from the patterned sacrificial layer 126 by a physical vapor deposition (PVD) of an aluminum alloy; however, any other suitable material and/or process may be used. The layer may be blanket deposited conformally over the relevant area to a thickness that will provide sufficient rigidity to support the later deposited mirror structure, yet have sufficient flexibility to enable tilting of the mirror under control of electrostatic forces applied via the electrodes. The difference between maximum and minimum thicknesses of the patterned sacrificial layer may be such as to give the supported mirror structure an elevation of, for example, 1 micron or so above the upper surface of the substrate.

Figure 2D:
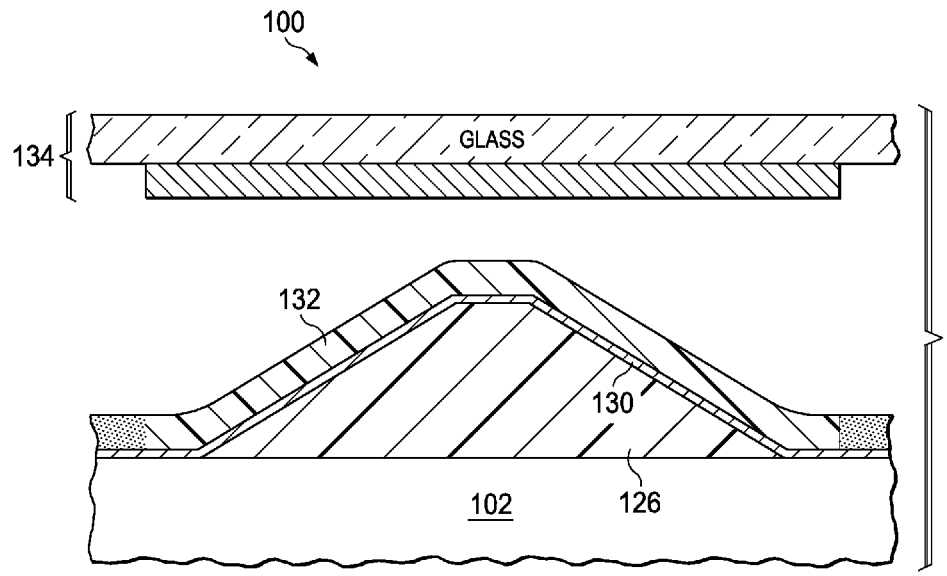
Figure 3D:
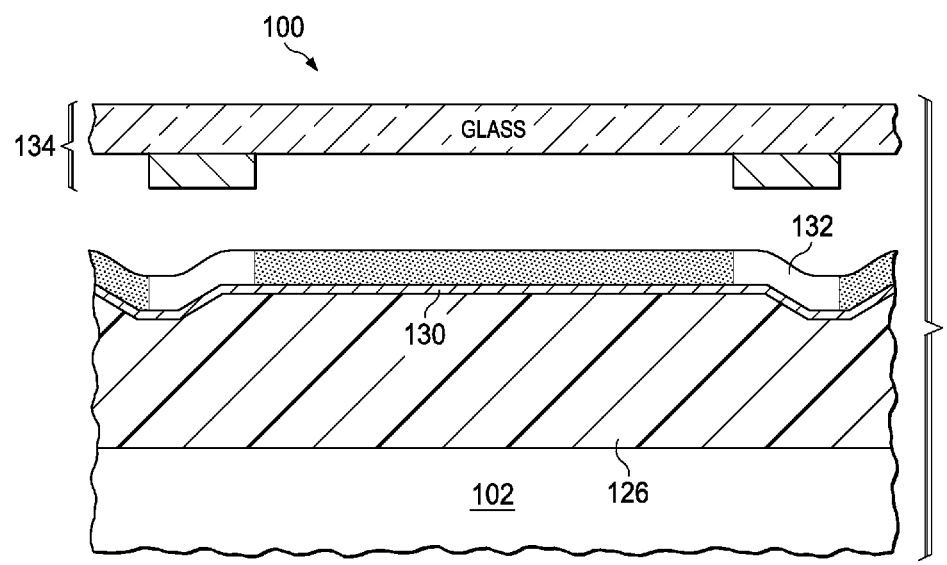

Referring to FIGS. 2D and 3D, a second layer 132 of patternable masking material is then formed over the deposited hinge layer 130. The layer 132 may suitably be a layer of positive photoresist applied over the hinge layer material with the previously patterned sacrificial layer 126 still in place. The material used for layer 132 may be a conventional high contrast material such as used in conventional patterning of a DMD hinge (see, e.g., hinge described in Pub. No. US 2009/0067025 A1), or may be the same material as used for layer 126, or other material chosen according to particular needs and preferences. The layer of positive photoresist 132 may be applied conformally to a substantially uniform thickness across the MEMS device 100 using a spray system, for example. Alternatively, the layer 132 may be applied to have a generally level upper surface, with a greater thickness over lower lying areas. The layer 132 is exposed through a hinge pattern photomask 134 which has radiation opaque and transmissive regions configured for providing the desired end contouring for the sloped hinge 104 and spring tips 110. Exposed portions of the conformal layer of positive photoresist 132 are depicted schematically by cross-hatching in FIGS. 2D and 3D.

Figure 2E:
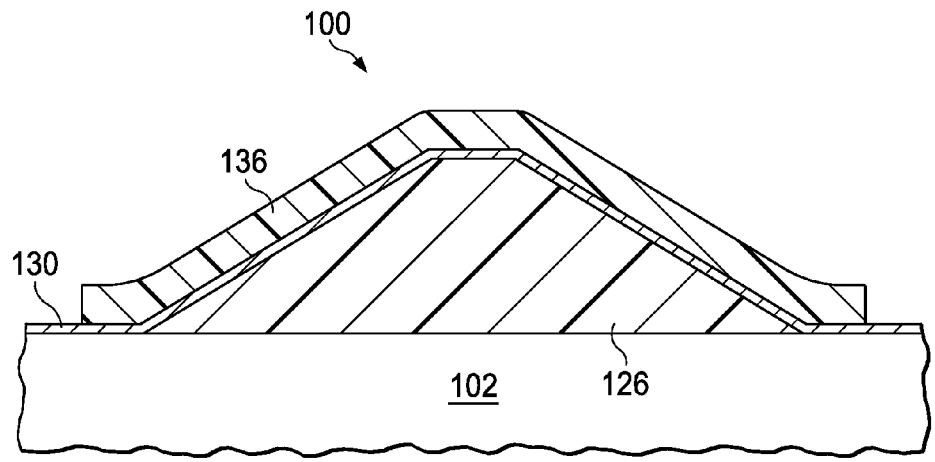
Figure 3E:
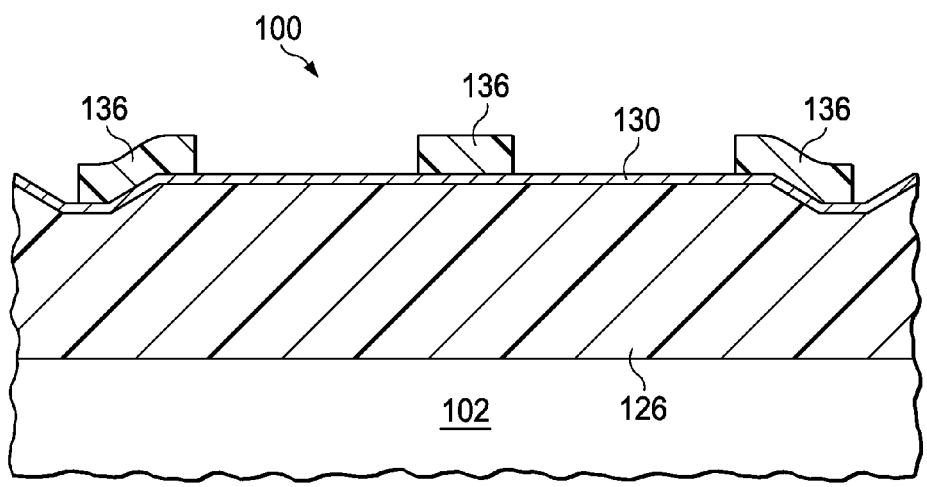

As shown in FIGS. 2E and 3E, a positive resist develop operation is then performed to remove exposed portions of photoresist layer 132 to leave a hinge etch mask 136 over the hinge material layer 130. The hinge etch mask 136 covers the hinge material layer 130 in areas forming the contours of the sloped hinge 104 and the spring tips 110. Using positive resist for the hinge etch mask 136 and positive resist for the grayscale sacrificial layer 126 may simplify the fabrication sequence for the MEMS device 100 by limiting deterioration of the grayscale sacrificial layer 126 during the develop operation for the hinge etch mask 136.

Figure 2F:
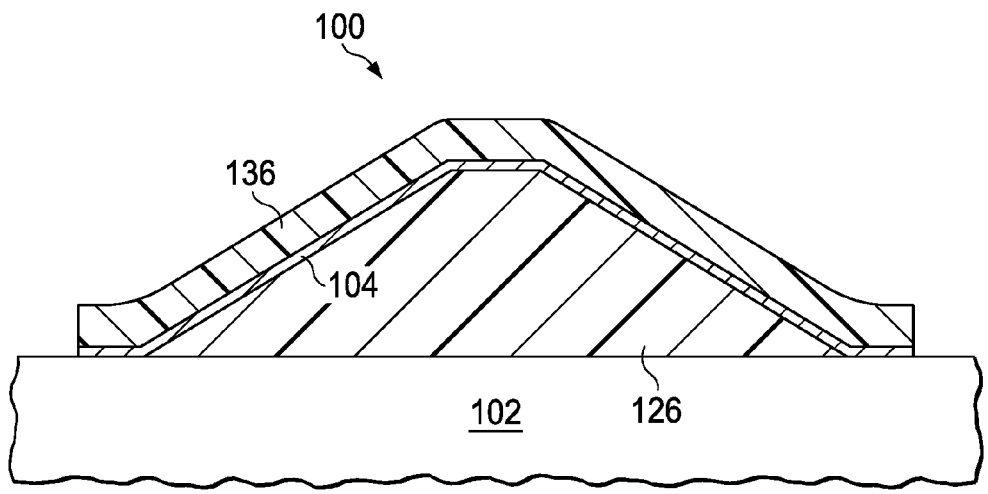
Figure 3F:
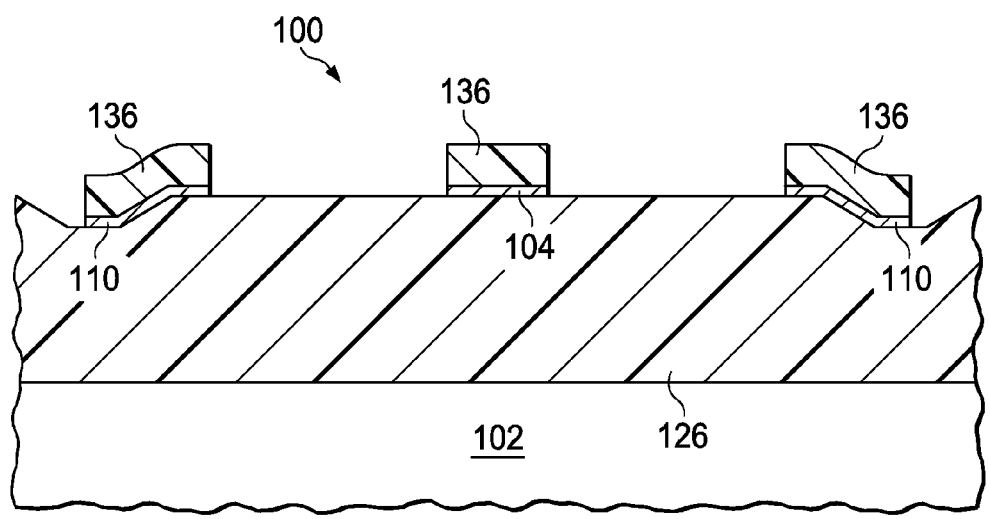

FIGS. 2F and 3F show the hinge etch mask 136 after performing a hinge etch process to remove unwanted portions of hinge material from the hinge material layer 130, thereby forming the sloped hinge 104 and the spring tips 110. The hinge etch process may include a plasma etch step using fluorine, chlorine and/or bromine radicals. The hinge etch mask 136 may be removed after the hinge etch process is completed, or may be removed in a subsequent step.

Figure 2G:
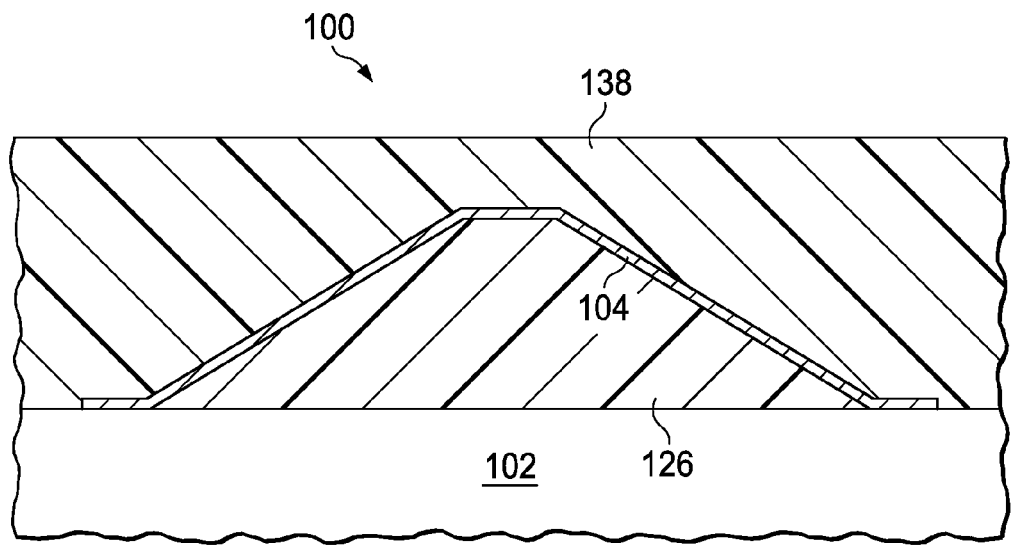
Figure 3G:
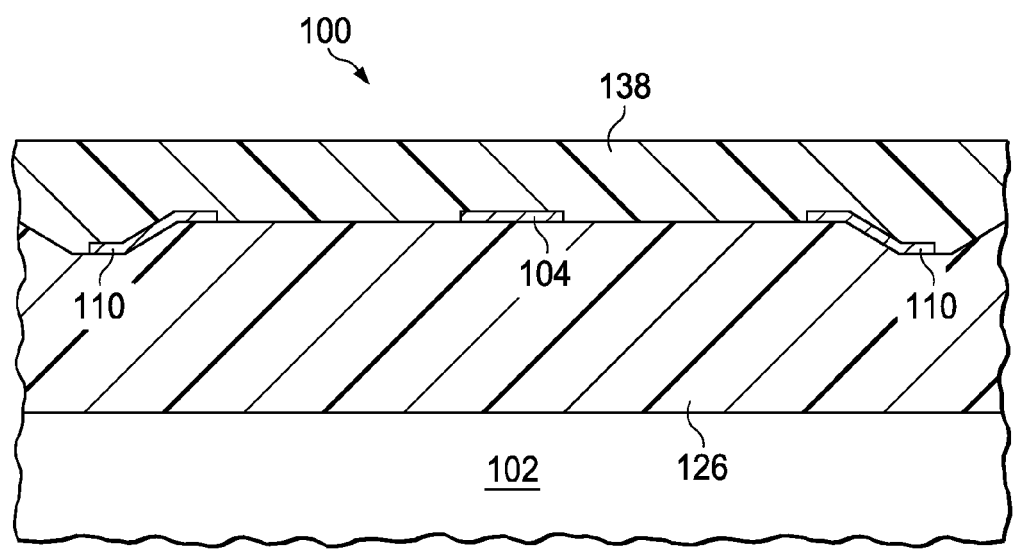

FIGS. 2G and 3G illustrate the formation of a second sacrificial layer 138 over the sloped hinge 104, the spring tips 110 and the first sacrificial layer 126, after hinge etch and removal of the hinge etch mask 136. (If the hinge etch mask 136 is left in place, the layer 138 is also formed over the hinge etch mask 136.) The second sacrificial layer 138 may include, for example, organic polymer such as novolac resin or polyimide. The second sacrificial layer 138 may be formed, for example, by spinning on a polymer dissolved in a solvent, followed by baking to remove a majority of the solvent. The second sacrificial layer is deposited to a level above the tops of the patterned hinge 104 and spring tips 110. The deposited layer 138 is then planarized (using mechanical and/or chemical planarization techniques) down to the tops of the hinge 104 and spring tips 110, to the level shown in FIGS. 2H and 3H. Layer 138 may, for example, be lowered by an isotropic ash process and/or using chemical-mechanical polishing, as appropriate for the selection of materials used for layer 138.

Figure 2H:
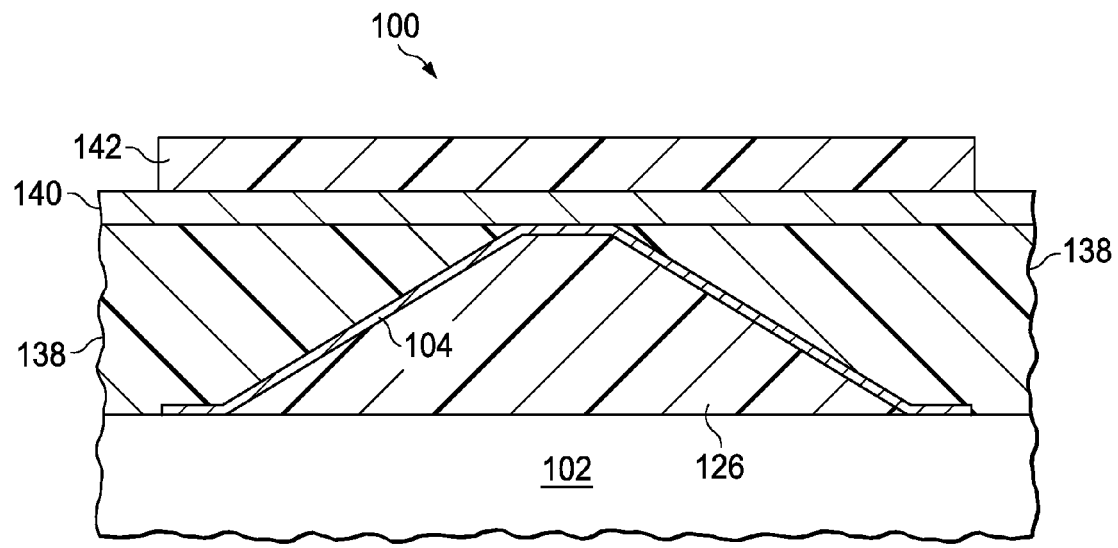
Figure 3H:
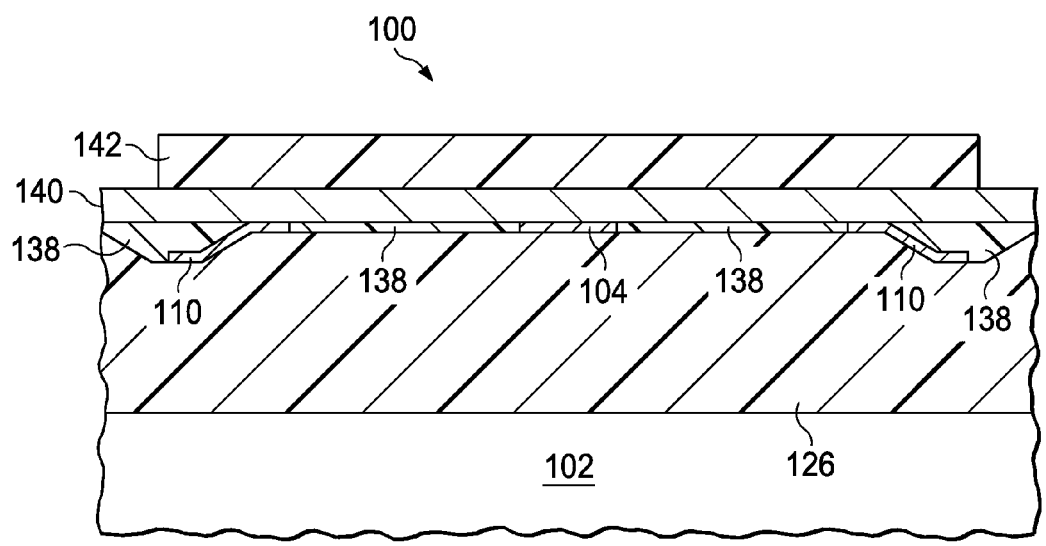

As shown in FIGS. 2H and 3H, the second sacrificial layer 138 is leveled to provide a horizontal top surface exposing top portions of the sloped hinge 104 and the spring tips 110. The top surface of the second sacrificial layer 138 may be substantially planar, at a level coplanar with likewise substantially planar same level top surfaces of the hinge 104 and spring tips 110. Good planarity may be useful, for example, in the formation of a micromirror device for achieving good planarity of an overdeposited mirror forming layer. The top surface of layer 138 may, however, alternatively be patterned to have a desired non-planar contoured surface profile for match needs and preferences suitable for other end fabricated MEMS devices.

A layer 140 of material for forming the movable member 108 is then deposited over the second sacrificial layer 138. Such layer 140 may take the form of a mirror material deposited over the planarized sacrificial layer 138, directly connecting material of layer 140 to the exposed top portions of the patterned hinge 104 and spring tips 110. The layer 140 may provide all material needed for the movable member 108 or may provide a portion of the material of member 108. A movable member etch mask 142 is then formed over layer 140 for patterning the movable member 108. The mask 142 extends over and covers the portions of the sloped hinge 104 and the spring tips 110 which connect to the layer 140. If the member 108 is a mirror, the layer 140 may, for example, include a layer of aluminum and one or more layers of reflection enhancing dielectric material over the aluminum layer.

Figure 2I:
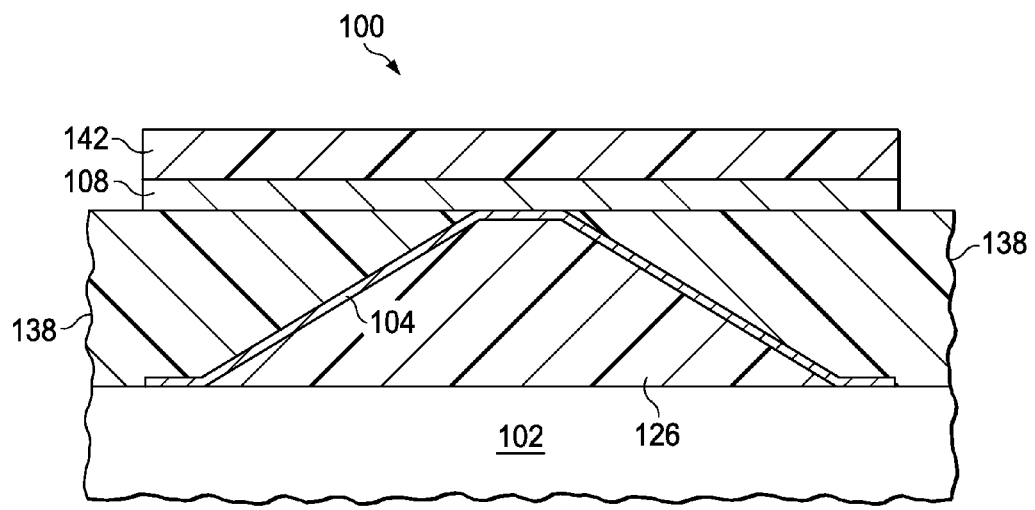
Figure 3I:
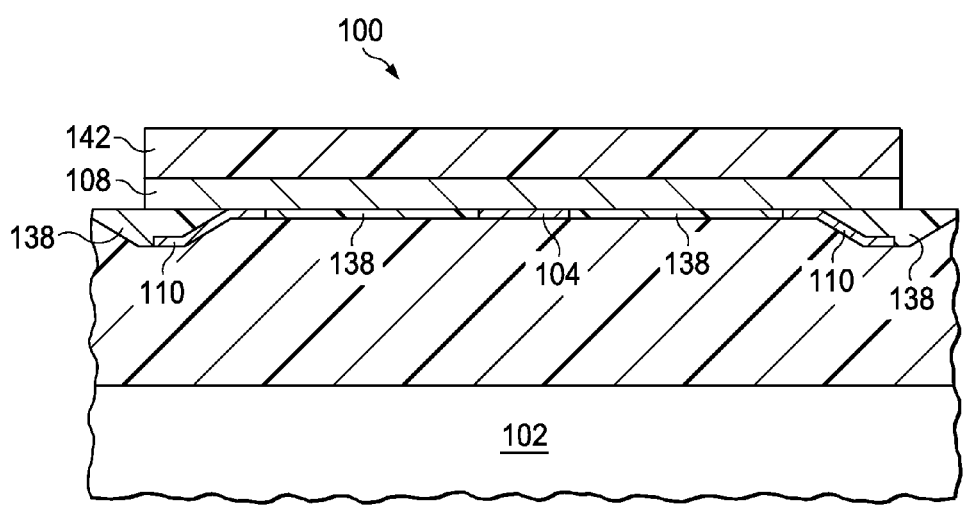

As shown in FIGS. 2I and 3I, a moving member etch process is performed which removes material from layer 140 exposed by the mask 142 to form at least a portion of the moving member 108. The moving member etch process may include a plasma etch process such as, for example, a reactive ion etch (RIE) process. The mask 142 may be removed after the etch process is completed, or may be removed in a subsequent step.

Figure 2J:
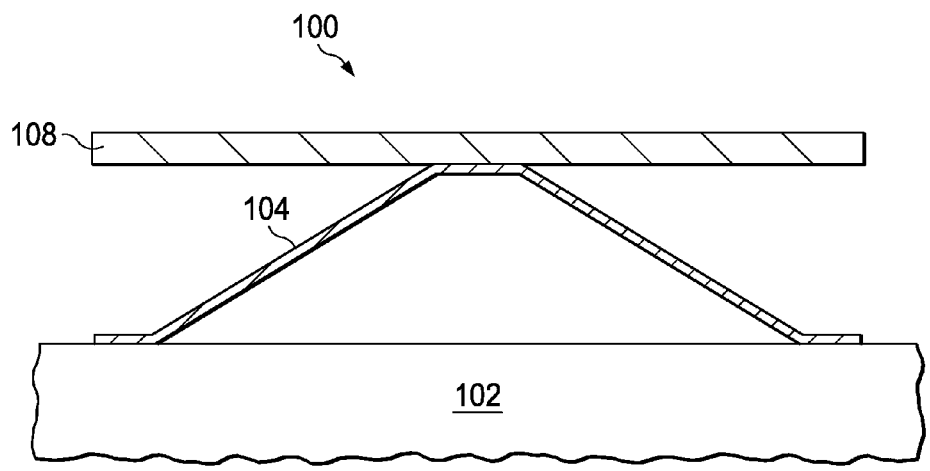
Figure 3J:
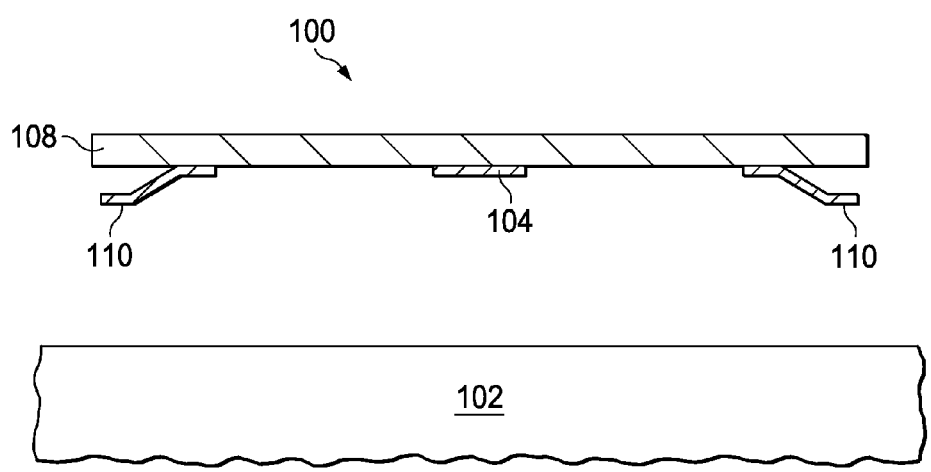

As shown in FIGS. 2J and 3J, a sacrificial layer removal process is then performed to remove material from the first and second sacrificial layers 126, 138, thereby freeing the movable member 108 for movement supported by the sloped hinge 104, and the spring tips 110 for spring-like motion limiting action relative to surrounding structure. The sacrificial layer removal process may also remove any remaining portions of the hinge etch mask 136 and moving member etch mask 142. The sacrificial layer removal process may include, for example, an isotropic etch process using oxygen and fluorine radicals, and/or ozone. The sacrificial layer removal process may be performed, for example, in a downstream etcher to reduce damage to the movable member 108, the sloped hinge 104 and the substrate base structure 102. Forming the sacrificial layer 126 of photoresist may advantageously reduce cost and complexity of the fabrication sequence.

Figure 4:
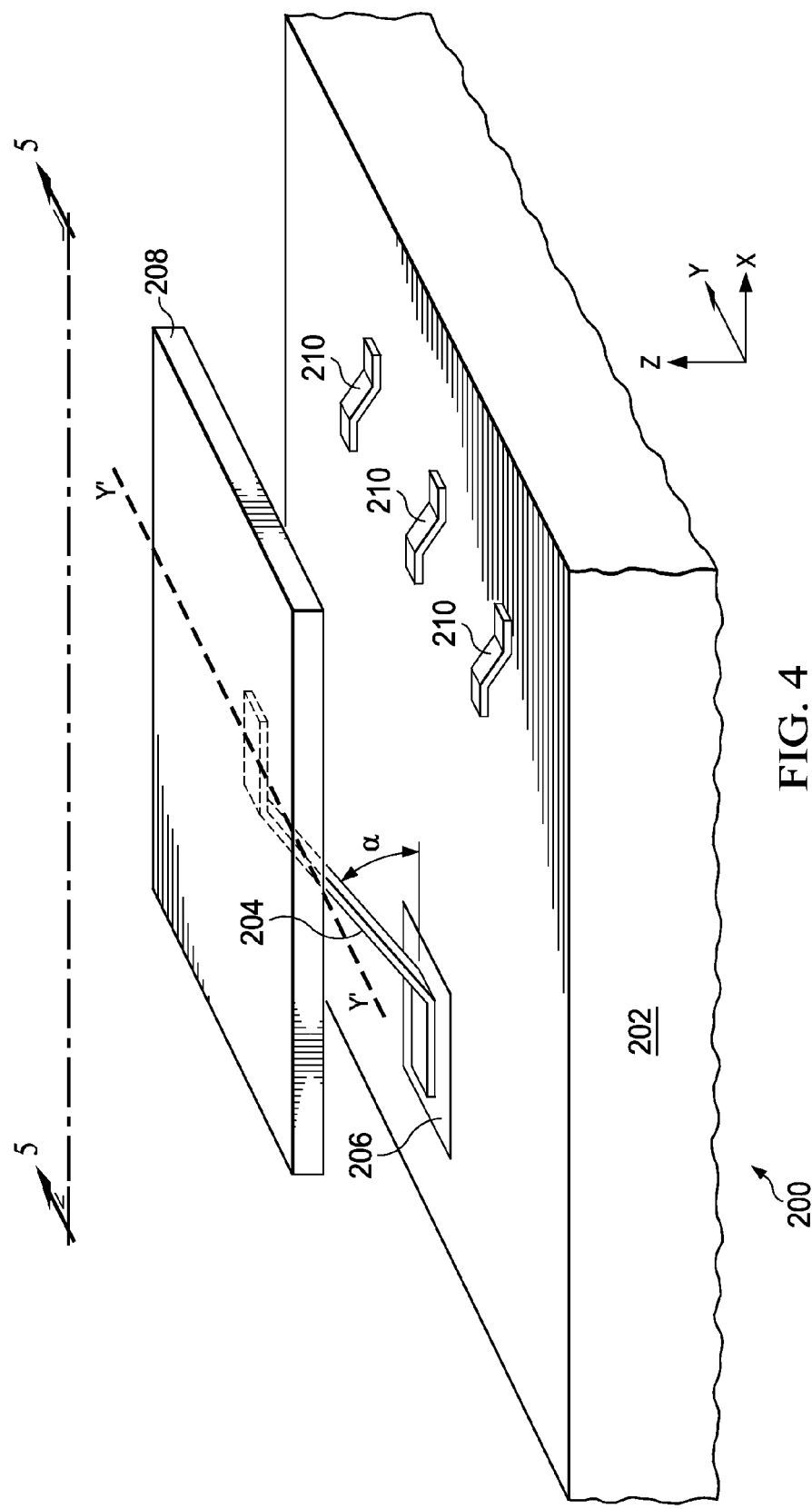
FIG. 4 is a perspective view of another example MEMS device.

FIG. 4 illustrates another example MEMS device 200 which has a movable member 208 supported in elevated position by a sloped support member 204, spaced by a gap above a substrate base 202. Like the movable member 108, movable member 208 may take the form of a metallic plate with generally planar configuration and having a specular polished upper surface such as representative of mirrored surfaces used in movable mirrors of micromirror array devices or the like. And, like the support member 104, support member 204 may be a metallic flexible hinge configured as a thin elongated element with generally uniform width, having a generally rectangular and horizontal movable member supporting platform at its top and a similarly shaped base at its bottom. Unlike the support member 104, however, support member 204 has only a single leg extending upwardly from the base to the top platform and supports the plate 208 centrally at its underside for tilting about a tilt axis Y'-Y' perpendicular to the hinge longitudinal axis in cantilever or torsion flexing fashion. As before, the leg has a generally uniform slope making an internal angle $\alpha$ of, e.g., 20-70° (such as about 30°) with a generally horizontal upper surface of the substrate. As before, the illustrated substrate 202 may be a die region of a silicon wafer, before or after singulation, on which are formed circuit components, such as electrodes and other electrical contacts 206 and circuit components, of an integrated circuit.

Device 200, similar to device 100, may include other features, such as one or more spring tips 210 which serve as flexible stops to limit downward movement of the adjacent edge of plate 208 during tilting, and to assist release from contact with the substrate for movement in the opposite direction by storing energy from the downward movement. In contrast to spring tips 110 described previously, spring tips 210 are illustrated attached to substrate 202 rather than to the plate 208. This is, of course, a matter of preference and specific requirements for the intended end application, and spring tips 210 could also be formed to attach to and extend beyond contours of the plate edge similar to the configuring of spring tips 110. Spring tips 210, like spring tips 110, may advantageously be formed concurrently with, and of a same material as, the sloped hinge 204.

In operation of MEMS device 200 with movable member 208 configured as a micromirror, the mirror plate 208 may be pivoted or tilted rotationally to or away from the spring tips 210 under action of electrostatic force applied to one or more electrodes located on substrate 202 (or at some intermediate position within the gap between substrate 202 and plate 208), with an electrical bias applied through contact 206 and conductive material of hinge 204 and mirror plate 208. The rotation of a leading edge of plate 208 toward the base 202 in response to electrostatic attraction acts against a restoring force applied through flexure of the sloped hinge 204. Downward movement of the leading edge of plate 208 may be stopped by encounter with spring tips 210, which act in spring-like manner to store energy from the downward movement for later release to assist push-off and restorative movement of plate 208 in the opposite direction.

FIGS. 5A-5H illustrate steps in an example method for the fabrication of the MEMS device 200 of FIG. 2. For illustrative purposes, the method describes variations of aspects of the example method for the fabrication of MEMS device 100 previously described with reference to FIGS. 2A-2J and 3A-3J. It should be appreciated, however, that devices such as MEMS device 200 may also be formed using aspects of the process steps previously described with reference to FIGS. 3A-3J and 4A-4J; and that devices such as MEMS device 100 may also be formed using aspects of the process steps described below with reference to FIGS. 5A-5H.

Figure 5A:
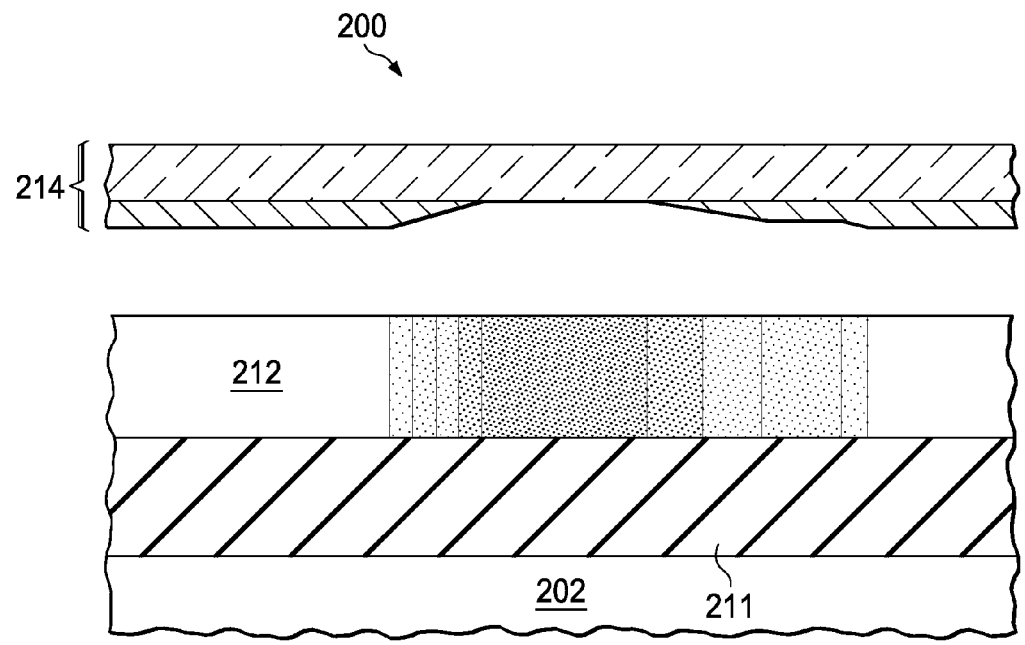
FIGS. 5A-5H are cross-sectional views illustrating steps in another example method of fabricating a MEMS device, corresponding to views taken along the section line 5-5 of FIG. 4.
Figure 5B:
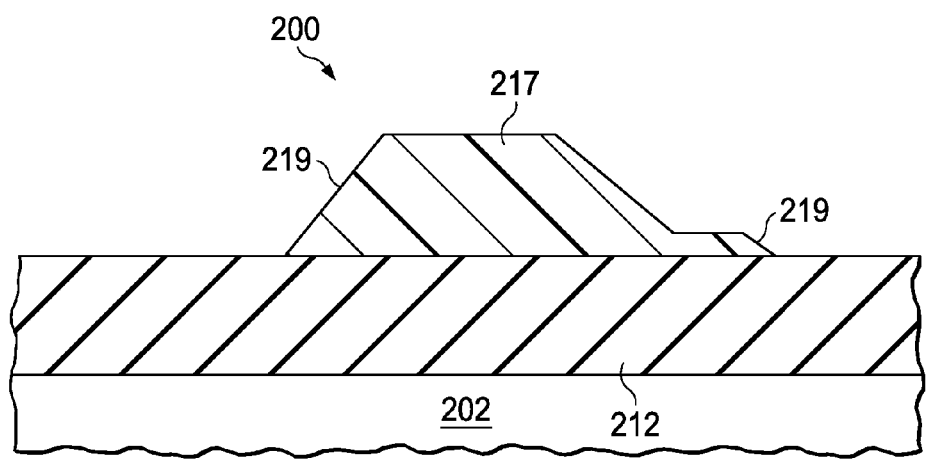

FIGS. 5A and 5B illustrate patterning to form a graded thickness first sacrificial layer 226 analogous to the sacrificial layer 126 previously described with reference to FIGS. 2A, 2B, 3A and 3B. In contrast to the previously described direct patterning and development of a deposited photoresist to form the layer 126, sacrificial layer 226 is formed by first patterning an overlying masking material layer and then etching a layer of sacrificial material through the overlying patterned mask.

As shown in FIG. 5A, a layer of sacrificial material 211 is formed over a substrate base 202. The substrate base 202 may be a singulated or unsingulated die formed from a semiconductor wafer material previously processed using CMOS or other processes to include memory and other circuit components and contacts. The sacrificial material 211 may include, for example, silicon dioxide formed using methylsilsesquioxane (MSQ) or an organic polymer such as polyimide. A layer of photoresist 212 is formed over the layer of sacrificial material 211. The photoresist 212 may be selected to have a relatively low contrast, to facilitate formation of a grayscale pattern. In contrast to the photoresist 112 previously described, the photoresist 212 may be a low contrast negative photoresist.

The photoresist layer 212 is exposed through a graded transmissivity photomask 214 to produce a grayscale exposure pattern. FIG. 5A depicts the grayscale pattern schematically as a dot pattern—a higher density of the dots indicating a higher degree of exposure and a lower density of dots indicating a lower degree of exposure. Photomask 214 has regions with varying thicknesses of light absorbing material, such as metal-transparent-metallic-oxides (MTMO) or bimetallic thin films. The photoresist layer 212 may include, for example, polyisoprene and a crosslinking photoinitiator such as 2,6-bis(4-azidobenzal)-4-methylcyclohexanone, so that exposure to 365 nm light causes the crosslinking photoinitiator to crosslink to tow polyisoprene molecules, thereby reducing the solubility in a developer solvent such as xylene.

FIG. 5B shows the device 200 after performing a negative resist develop operation which removes graded unexposed portions of the negative photoresist 212 to leave a correspondingly graded thickness contoured photoresist mask pattern 217 over the layer of sacrificial material 212. The patterned photoresist 217 has sloped surfaces 219 contoured to produce sloped portions of the sloped hinge 204 and spring tips 210.

Figure 5C:
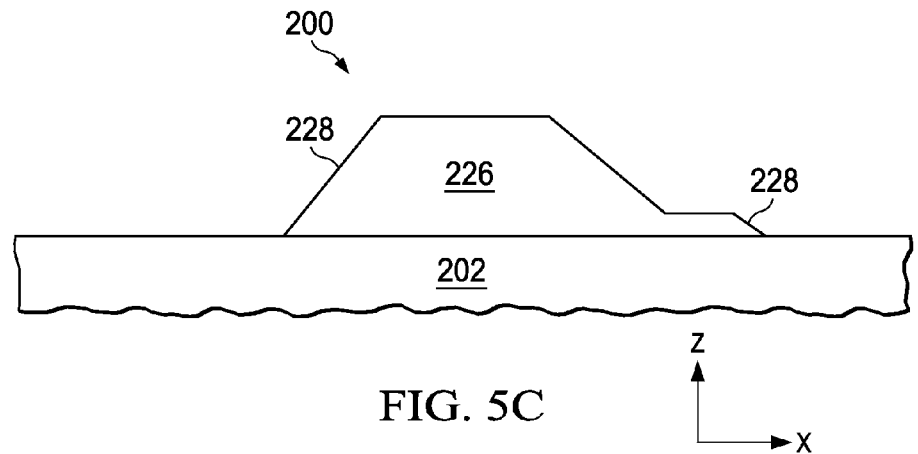

FIG. 5C shows the device 200 after performing a transfer etch which concurrently etches the grayscale photoresist pattern 217 and the layer of sacrificial material 212 so as to form a graded thickness sacrificial layer 226 of the sacrificial material 212 having a contour matching that of the previously patterned photoresist 217. The transfer etch is performed so as to transfer the sloped surfaces 219 in the grayscale photoresist pattern 217 to sloped surfaces 228 in the etched sacrificial layer 226. The transfer etch may include, for example, an RIE process using oxygen and fluorine radicals.

As shown in FIG. 5C, the patterned sacrificial layer 126 has a region with a hill-like cross-sectional contour in the X-Z plane which has an upwardly right directed right side of uniform positive slope extending up from the substrate (corresponding to uniformly graded minimum to maximum negative photoresist exposure) to a generally level horizontal platform portion of maximum thickness (corresponding to an area of maximum exposure of the negative photoresist), followed by a downwardly right directed stepped left side of uniform negative slope descending down from the maximum thickness platform portion, to an intermediate thickness generally level horizontal portion, and then through another uniform negative sloped portion down to the substrate. It will be appreciated that the patterned sacrificial layer 226 could also have been formed by direct patterning, without transferring a pattern from an overlying masking layer, using a positive (or negative) low contrast photoresist as the sacrificial material in a manner such as described previously for the formation of layer 126.

Figure 5D:
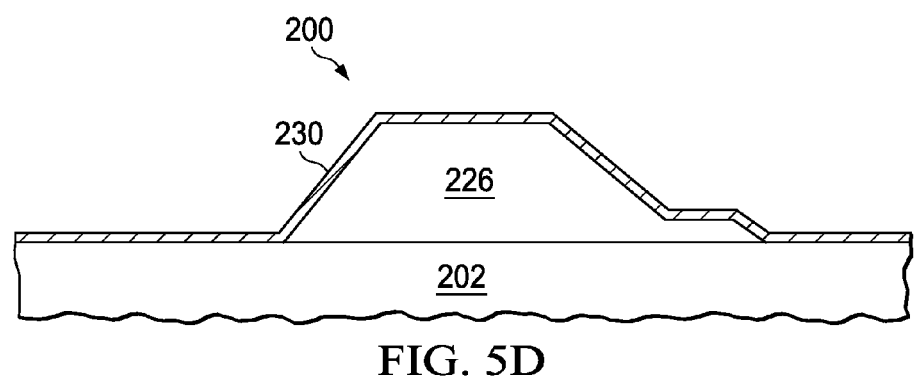

In FIG. 5D, a thin layer of hinge material 230 is formed over the grayscale patterned sacrificial layer 226 and over adjacent portions of substrate 202 exposed by the transfer etch. The hinge material layer 230 may be a material such as described previously for corresponding layer 130 and may include metals, semiconductors, polymers and/or inorganic dielectrics. Choice of hinge material may depend on the intended function of the MEMS device 200. In the cases of a device 200 having the form of a digital micromirror device, for example, layer 230 may be a conductive metallic layer comprising an aluminum alloy blanket deposited to a thickness sufficient for support of a later deposited mirror structure, but with enough flexibility to enable tilting of the mirror under control of electrostatic forces.

Figure 5E:
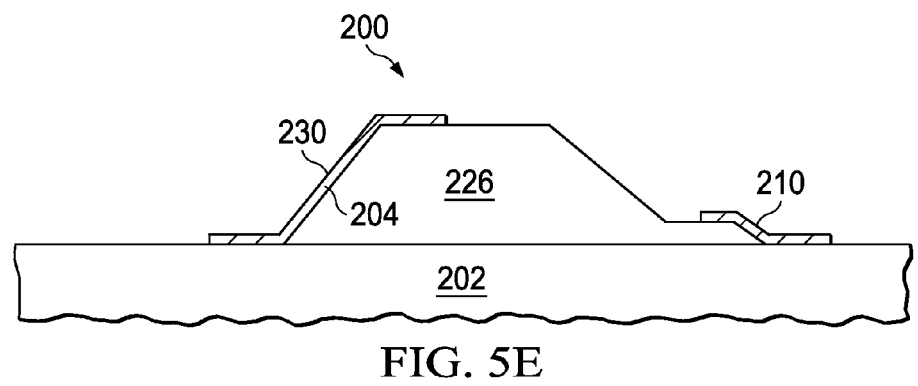

FIG. 5E illustrates device 200 after patterning of the hinge material layer 230 to form the sloped hinge support member 204 and spring tips 210. The patterning may be done using a high contrast positive resist to apportion the layer 230 into distinct segments of generally uniform thickness, in a manner similar to that described previously for the patterning of hinge layer 130, above. The patterning may alternatively be done using a negative photoresist, or using a low contrast photoresist (esp. where thickness variation is to be achieved).

Figure 5F:
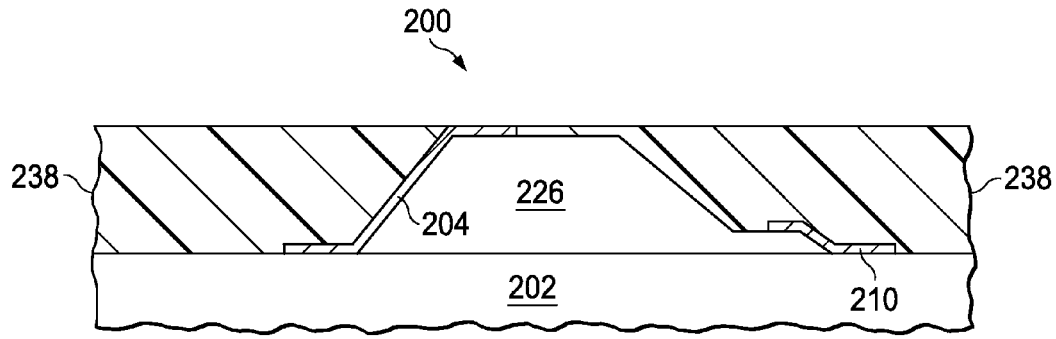

FIG. 5F shows device 200 after the formation of a second sacrificial layer 238 over the sloped is formed over the sloped hinge 204, the spring tips 210 and the grayscale patterned first sacrificial layer 226. The sacrificial layer 238 is deposited to a level above the top of the sloped hinge 204, then planarized down to expose the top surface of the platform portion at the top of the sloped hinge 204. The material of sacrificial layer 238 may be the same as or different from the material for sacrificial layer 226. In the case of a device 200 in the form of a micromirror device, the layer 238 may be a photoresist or any other material suitable for forming and supporting an overlying mirror structure in such device.

Figure 5G:
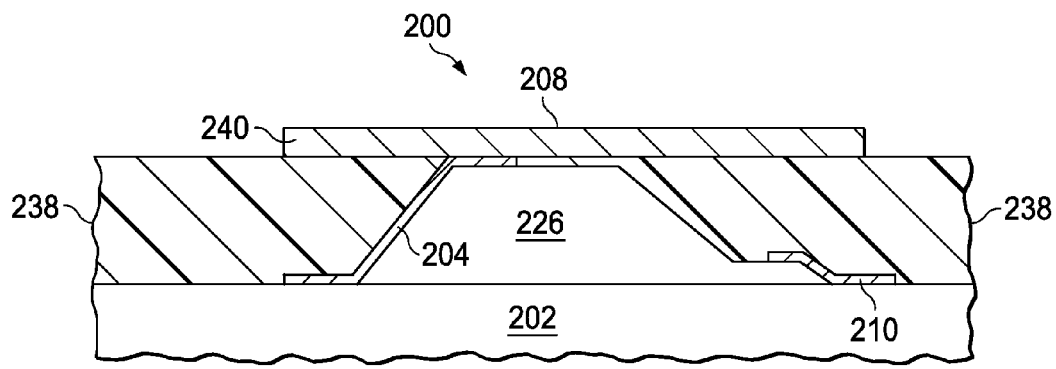

FIG. 5G shows device 200 following the formation of a layer 240 of material over the planarized second sacrificial layer 238, and the patterning of layer 240 to form the movable member 208. Layer 240 may take the form of a mirror forming material deposited over the planarized layer 238, directly connecting material of layer 240 to the exposed top of the patterned hinge 204. Layer 140 may, for example, include one or more layers of aluminum and other reflection enhancing material.

Figure 5H:
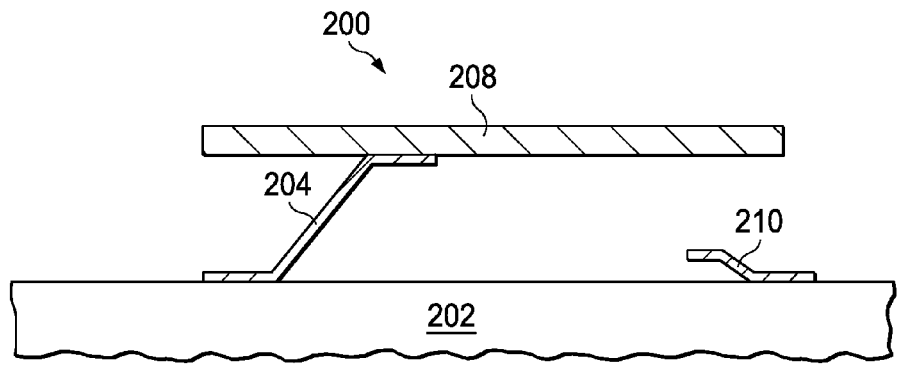

And, FIG. 5H shows device 200 after removal of material of the first and second sacrificial layers 226, 238 to release the movable member 208 for movement supported by the sloped hinge 204 about the pivotal axis Y'-Y', toward and away from contact with the spring tips 210 (see FIG. 4). For sacrificial layers including silicon dioxide, the sacrificial layer removal process may include a vapor phase HF etch or a liquid phase etch. For sacrificial layers including photoresist, the removal may be as previously described or as otherwise appropriate for photoresist removal.

Figure 6:
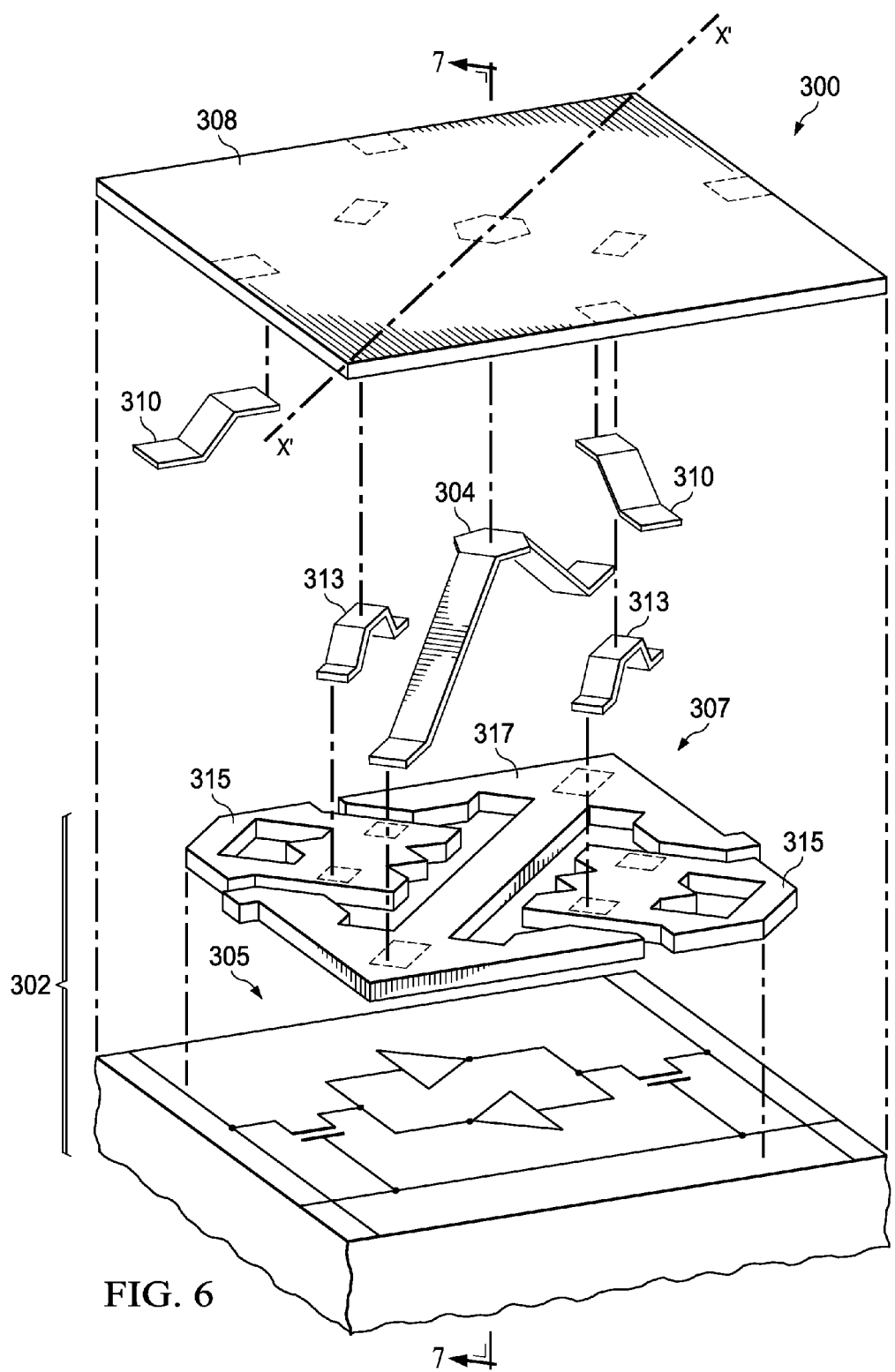
FIG. 6 is an exploded perspective view of an example DMD MEMS device.

FIG. 6 illustrates application of the above principles to the formation of an example DMD MEMS device 300 of a type such as described in U.S. Pat. No. 7,404,909 B2 and Pub. No. US 2009/0067025 A1 having a rectangular micromirror element 308 supported in elevated position by a sloped hinge member 304 for tilting movement about a diagonal axis X'-X' relative to a substrate 302. (Features of the illustrated structure can be compared with corresponding features of structures illustrated in FIG. 9 of U.S. Pat. No. 7,404,909 B2 and FIG. 1 of US 2009/0067025 A1.)

The substrate 302 includes control circuitry 305 located therein or thereon and a patterned conductive feature 307 located over the control circuitry 305. The DMD further includes a patterned hinge structure 304, spring tips 310 and electrode extensions 313 located over the patterned conductive feature 307 and a patterned mirror structure 308 located over the patterned hinge structure 304. The control circuitry 305 may comprise a plurality of CMOS devices, including addressable SRAM or other memory circuits, and may be covered with an insulating layer, such as an oxide (e.g., silicon oxide) that has been planarized by chemical mechanical planarization. The conductive feature 307 may comprise aluminum or aluminum alloy with vias formed in the insulating layer to allow the conductive feature 307 to contact the underlying control circuitry 305, where necessary. The illustrated conductive feature is formed from a common deposited layer of conductive material that is patterned and etch to configure electrode pads 315 and a bias bus 317. (Compare with elements 110, 114a, 114d shown in FIG. 1 of US 2009/0067025 A1.)

Applying the principles disclosed herein, the patterned hinge structure 304, spring tips 310 and electrode extensions 313 may be formed as sloped members using steps such as those described above for the formation of devices 100 or 200. For example, the hinge structure 304 may be formed similar to the described support member 104, with an apex centrally positioned at a raised juncture of top ends of two oppositely outwardly and downwardly directed legs with bottom ends connected to respective opposite platforms of the bus element 317. The movable mirror element 308 may be centrally mounted at its underside on the hinge apex platform for tilting rotationally about the tilt axis X'-X' parallel to the diagonal of the mirror 308. Spring tips 310 may be formed connected to edges of mirror 308 as shown, similar to the formation of spring tips 110 described above in connection with device 100. Alternatively, the tips 310 may be formed in connection with substrate 302 as described for spring tips 210 of device 200, or may be formed integral with lateral extensions of the bases of the legs of hinge structure 304. Sloped electrode extensions 313 may optionally be formed together with the formation of the sloped hinge 304 and spring tips 310, connecting to respective underlying electrode pads 315 as indicated.

Figure 7:
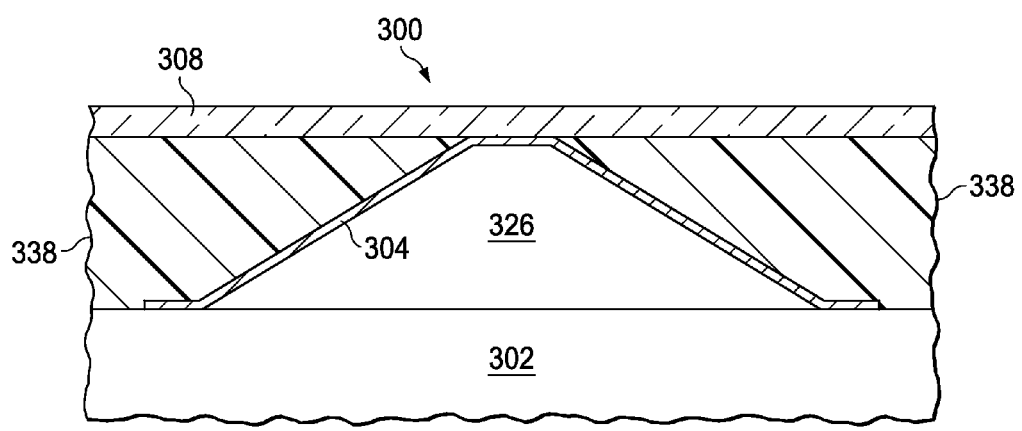
FIG. 7 is a cross-sectional view taken along section line 7-7 of FIG. 6, illustrating the fabrication of a portion of the DMD MEMS device of FIG. 6.

In contrast to formation of the corresponding structures in U.S. Pat. No. 7,404,909 and US 2009/0067025 (compare, e.g., 108, 116, 112 and FIG. 2A in US 2009/0067025 A1), grayscale patterning of the first sacrificial layer 326 as described herein enables the definition of the sloped hinge 304 for direct support of the mirror 308 above the substrate 302 without formation of hinge posts and support posts, and without a void formed centrally in the mirror structure. FIG. 7 illustrates an intermediate stage in the formation of the patterned mirror 308 over the sloped hinge 304 of FIG. 6 in a view that corresponds to that of FIG. 2I discussed above, after removal of the mirror etch mask 142. (This can be compared with the view showing the mirror 104 with support post 112 and void 230 formed over hinge 106 and hinge posts 108 given in FIG. 2A of US 2009/0067025 A1.)

Those skilled in the art will appreciate that modifications may be made to the described embodiments, and also that many other embodiments are possible, within the scope of the claimed invention.

What is claimed is:

1. A microelectromechanical (MEMS) device, comprising:
   a substrate;
   a movable member; and
   a sloped support member supporting the movable member in elevated position, spaced by a gap above the substrate;
   wherein the substrate comprises a die region of a silicon wafer, on which are formed circuit components including electrodes and electrical contacts of an integrated circuit;
   wherein the movable member comprises a metallic plate having a generally planar configuration;
   wherein the support member comprises a metallic flexible hinge; and
   wherein the hinge has an apex centrally positioned at a raised juncture of top ends of two upwardly oppositely directed and symmetrically converging legs whose bottom ends are connected to the substrate.

2. The device of claim 1, wherein the plate has a specular polished upper surface; and the device comprises a micromirror array device.

3. The device of claim 1, wherein the hinge comprises a thin elongated element with generally uniform width; the apex presents a generally horizontal platform which is coplanar with generally horizontal leg bottom ends; and the legs extend upwardly to the apex from their bottom ends with generally uniform slope making an internal angle of 20-70° with an upper surface of the substrate.

4. The device of claim 1, wherein the plate is mounted centrally above the hinge apex platform for tilting rotationally about a tilt axis parallel to a hinge longitudinal axis with flexure of the hinge legs in response to application of electrostatic forces.

5. The device of claim 4, wherein the circuit components comprise a memory cell and electric biasing circuitry utilizable to individually address and selectively set the position of the plate.

6. The device of claim 5, wherein the leg bottom ends are connected directly to one or more contact pads formed on the substrate, and a center of an underside of the plate is directly connected to a top of the apex platform of the hinge.

7. The device of claim 6, further comprising one or more spring tips attached to and extending beyond contours of plate, and adapted to serve as flexible stops to limit downward movement of an adjacent plate edge, and to assist release from contact with the substrate for movement in an opposite direction by storing energy from the downward movement.

8. The device of claim 7, wherein the spring tips comprise thin elongated elements of generally uniform width, with generally horizontal upper ends attached marginally at respective edges to the underside of the plate, and outwardly directed portions extending downwardly at an angle 70-20° from a plate plane with generally uniform slope to respective free generally horizontal outwardly directed lower ends.

9. A method of fabricating a microelectromechanical (MEMS) device, the method comprising:
  forming a first sacrificial layer over a substrate;
  patterning the first sacrificial layer with a grayscale exposure pattern to configure the first sacrificial layer with sloped surfaces;
  forming a layer of hinge material conformally over the patterned first sacrificial layer;
  patterning the layer of hinge material to form a sloped hinge;
  forming a second sacrificial layer over the sloped hinge and over a remaining portion of the patterned first sacrificial layer, the second sacrificial layer being deposited to a level above the sloped hinge;
  planarizing the second sacrificial layer down to expose a top portion of the sloped hinge;
  forming a layer of member material over the planarized second sacrificial layer and exposed top portion of the sloped hinge;
  patterning the layer of member material to form a member; and
  removing remaining portions of the first and second sacrificial layer;
  whereby the member is supported by the sloped hinge in elevated position spaced for movement relative to the substrate.

10. The method of claim 9, wherein patterning the layer of hinge material further forms a spring tip.

11. The method of claim 10, whereby the spring tip is supported by one of the member or the substrate, and is configured to serve as a flexible stop to limit the relative movement and to store energy from a direction of the relative movement for release in another direction of the relative movement.

12. The method of claim 11, wherein planarizing the second sacrificial layer also exposes a top portion of the spring tip; and whereby the spring tip is supported by an edge of the member.

13. The method of claim 9, wherein the first sacrificial layer comprises a first layer of photoresist, and patterning the first sacrificial layer comprises exposing the first layer of photoresist to the grayscale exposure pattern.

14. The method of claim 13, wherein patterning the first sacrificial layer configures the first sacrificial layer with a hill-like cross-sectional contour which has an upper portion of greater thickness and at least one side of generally uniform slope extending upwardly from a bottom portion of lesser thickness bottom to the upper portion.

15. The method of claim 14, wherein the upper portion is centrally positioned at a raised juncture of two upwardly directed and symmetrically converging sides which extend with generally uniform opposite slopes up from laterally spaced bottom end portions of minimum thickness.

16. The method of claim 15, wherein patterning the first sacrificial layer further configures the first sacrificial layer with at least one other hill-like cross-sectional contour which has a first portion of a first thickness and at least one side of generally uniform slope extending to a second portion of second thickness different from the first thickness.

17. The method of claim 16, wherein the first portion is a base portion of lesser thickness centrally positioned at a lowered juncture of two downwardly directed and symmetrically converging sides which extend with generally uniform opposite slopes down from laterally spaced top end portions of greater thickness.

18. The method of claim 17, wherein the greater thickness is the maximum thickness; and wherein the at least one other hill-like cross-sectional contour comprises two substantially similar other hill-like cross-sectional contours, and a generally flat region separating the two substantially similar other hill-like cross-sectional contours.

19. A microelectromechanical (MEMS) device, comprising:
  a substrate;
  a movable member; and
  a sloped support member supporting the movable member in elevated position, spaced by a gap above the substrate;
  wherein the substrate comprises a die on which are formed circuit components of an integrated circuit;
  wherein the movable member comprises a plate having a generally planar configuration;
  wherein the support member comprises a flexible hinge; and
  wherein the hinge has an apex centrally positioned at a raised juncture of top ends of two upwardly oppositely directed converging legs whose bottom ends are supported on the substrate.

20. The device of claim 19, wherein the hinge comprises an elongated element; the apex presents a platform supporting the plate; and the legs extend upwardly to the apex from their bottom ends with generally uniform slope making an internal angle of 20-70° with an upper surface of the substrate.

* * * * *